United States Patent
Copeland (10) Patent No.: US 7,782,974 B2
(45) Date of Patent: Aug. 24, 2010

(54) APPARATUS AND METHOD PROVIDING NON-LINEAR ADAPTIVE SIGNAL TRACKING

(75) Inventor: Gregory Clark Copeland, Plano, TX (US)

(73) Assignee: Texas Instuments Incorporated, Dallas, TX (US)

( * ) Notice: Subject to any disclaimer, the term of this patent is extended or adjusted under 35 U.S.C. 154(b) by 1186 days.

(21) Appl. No.: 11/388,356

(22) Filed: Mar. 24, 2006

(65) Prior Publication Data

US 2008/0123770 A1    May 29, 2008

(51) Int. Cl.
*H04L 27/00* (2006.01)
(52) U.S. Cl. .................. 375/295; 330/149; 600/408; 706/14
(58) Field of Classification Search .......... None
See application file for complete search history.

(56) References Cited

U.S. PATENT DOCUMENTS

2001/0022532 A1 *  9/2001  Dolman ............... 330/149

\* cited by examiner

*Primary Examiner*—David C Payne
*Assistant Examiner*—Adolf Dsouza
(74) *Attorney, Agent, or Firm*—John J. Patti; Wade J. Brady, III; Frederick J. Telecky, Jr.

(57) ABSTRACT

An apparatus providing additional response for a distortion correcting device that receives a first signal at a correcting input and provides a first delayed output signal at an output includes: (a) A first signal combiner coupled with an input and the correcting input. (b) A delay unit coupled with the input provides a second delayed signal to a delayed signal terminal. (c) A second signal combiner coupled with the delayed signal terminal and the output employs the output signal and the second delayed signal to present an error signal at a first error terminal. (d) An adaptive circuit coupled with the input locus, the first signal combiner and the second signal combiner employs provides a supplemental signal to the first signal combiner which employs the input signal and the supplemental signal to present the first signal to reduce the error signal.

13 Claims, 9 Drawing Sheets

APPARATUS AND METHOD PROVIDING NON-LINEAR ADAPTIVE SIGNAL TRACKING

TECHNICAL FIELD

The invention relates generally to distortion correcting methods and devices and, more particularly, to distortion correcting methods and devices configured for adaptive digital predistortion for signal correction for improved signal treatment.

BACKGROUND

Conventional distortion correcting methods and devices, especially conventional distortion correcting methods and devices configured and employed for signal predistortion, compute linearization parameters for signal treatment off-line in software-executing circuitry. Such off-line software treatment contributes to slow adaptation time as compared with the period of the signal being treated, such as a radio frequency (RF) signal. As a result, longer term variations are compensated by the distortion correcting device, but shorter term variations are not addressable because of the slow adaptation time of the method and apparatus.

By way of example and not by way of limitation, a distortion compensation device such as a signal predistortion device may be employed in a mobile telephone network within a transceiver station at a remote location. Various environmental and operational parameters may be present in such a location. Slow changing parameters may include changes in the temperature within the equipment cabinet as the sun rises and sets, and changes in temperature as the equipment within the cabinet operates at higher or lower levels. As temperature changes, gain of transistors may change, matching networks and other linear circuit components may change response characteristics and other circuitry operational characteristics may be altered. Such a relatively slow-changing parameter as temperature change may be appropriate for predistortion signal handling by conventional devices.

Other changes experienced by equipment may be a change in power supply parameters when air conditioning equipment turns on or turns off. Such a temperature or power level change may be too short in duration to be adequately compensated by conventional predistortion signal handling devices to meet industry standards relating to purity and stability of signaling. As an example, such standards have been imposed by the Federal Communications Commission (FCC).

There is a need for a near-real time adaptive capability for predistortion signal handling devices that permits rapid response to environmental and other changes affecting operation of a signaling system.

SUMMARY

An apparatus providing additional response for a distortion correcting device that receives a first signal at a correcting input and provides a first delayed output signal at an output includes: (a) A first signal combiner coupled to an input and the correcting input. (b) A delay unit coupled to the input provides a second delayed signal to a delayed signal terminal. (c) A second signal combiner coupled to the delayed signal terminal and the output employs the output signal and the second delayed signal to present an error signal at a first error terminal. (d) An adaptive circuit coupled to the input node, the first signal combiner and the second signal combiner employs provides a supplemental signal to the first signal combiner which employs the input signal and the supplemental signal to present the first signal to reduce the error signal.

A method for provides additional response for a distortion correcting device. The distortion correcting device receives a first signal at a correcting input node and provides an output signal at an output node. The output signal is delayed with respect to the first signal by a first delay interval. The method includes the steps of: (a) In no particular order: (1) providing a first signal combining unit coupled to an input node and with the correcting input node; (2) providing a delay unit coupled to the input node; (3) providing a second signal combining unit coupled to the first delay unit and with the output node; and (4) providing at least one adaptive circuit coupled to the input node, the first signal combining unit and the second signal combining unit. (b) Operating the delay unit to receive an input signal from the input node and provide a delayed input signal to a first delayed signal terminal. The delayed input signal is delayed with respect to the input signal by a second delay interval. The second delay interval is substantially equal to the first delay interval. (c) Operating the second signal combining unit to employ the output signal and the delayed input signal to present an error signal at a first error indicating terminal. (d) Operating the at least one adaptive circuit to employ a feedback signal related with the error signal and the input signal to present a supplemental correcting signal to the first signal combining unit. The first signal combining unit employs the input signal and the supplemental correcting signal to present the first signal to the correcting input node. The supplemental correcting signal is appropriate to reduce the error signal.

It is, therefore, an object of the present invention to provide an apparatus and method for permitting a real time adaptive capability for predistortion signal handling devices that permit rapid response to environmental and other changes affecting operation of a signaling system.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENT

Refer now to the drawings wherein depicted elements are, for the sake of clarity, not necessarily shown to scale and wherein like or similar elements are designated by the same reference numeral through the several views.

Figure 1:
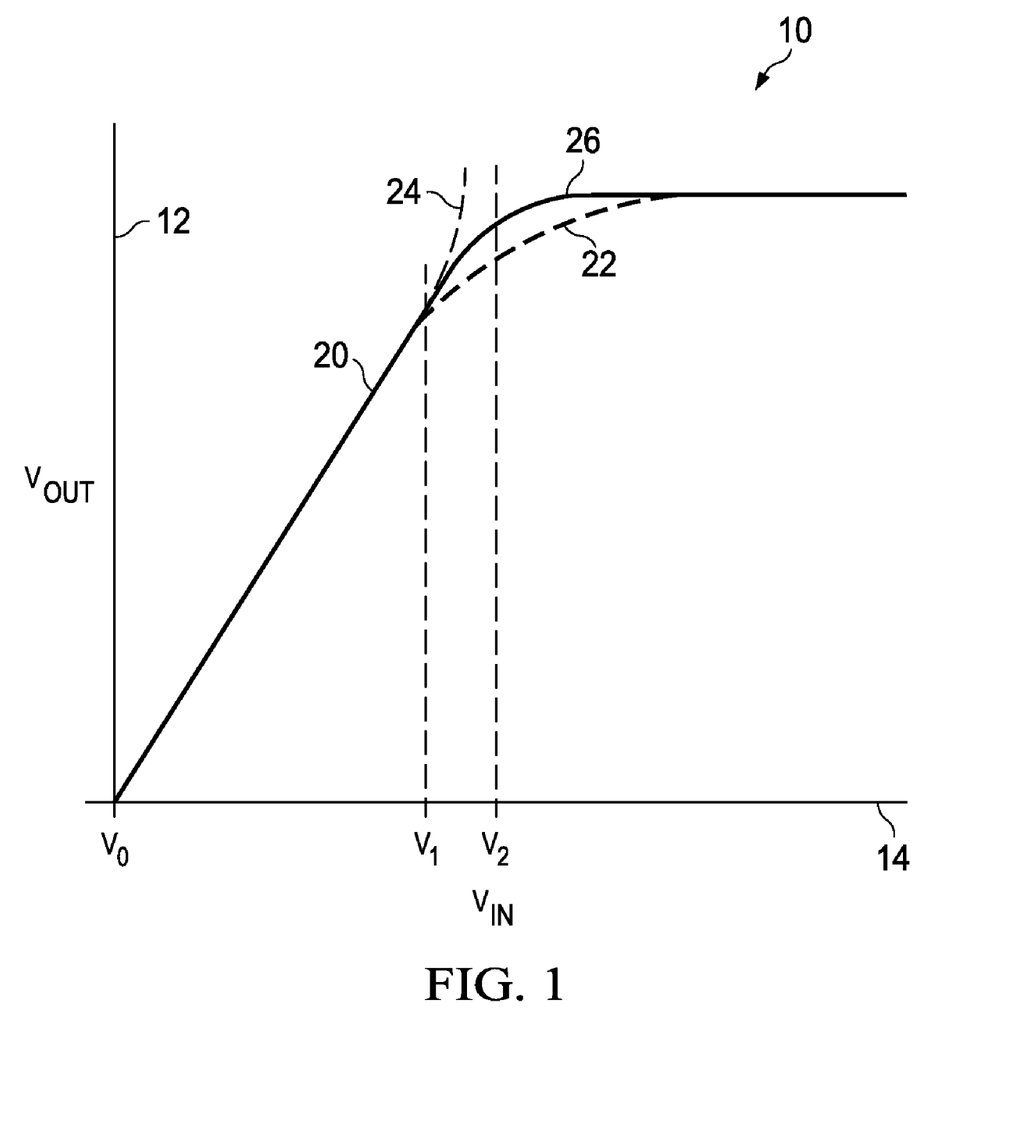
FIG. 1 is a graphical representation of voltage responses of representative distortion correcting devices.

FIG. 1 is a graphical representation of voltage responses of representative distortion correcting devices. In FIG. 1, a graphic representation 10 includes a vertical axis 12 representing output voltage ($V_{OUT}$) from a predistortion device (not shown in FIG. 1) and a horizontal axis 14 representing input voltage ($V_{IN}$) to the predistortion device. A response curve section 20 between voltage $V_0$ and voltage $V_1$ on axis 14 indicates a substantially linear relation between input voltage $V_{IN}$ and output voltage $V_{OUT}$. A response curve section 22 above voltage $V_1$ on axis 14 is a representative response relationship between input voltage $V_{IN}$ and output voltage $V_{OUT}$ for a conventional predistortion device. Response curve 22 indicates a substantially non-linear relation between input voltage $V_{IN}$ and output voltage $V_{OUT}$ for input voltages above input voltage $V_1$. It is a desirable design goal that a linear relation between input voltage $V_{IN}$ and output voltage $V_{OUT}$ be maintained for as high an input voltage $V_{IN}$ as possible. To achieve such linearity above input voltage $V_1$, a compensating voltage, represented by a compensating response curve 24 in FIG. 1, is provided for additive combination with response curve 22 above input voltage $V_1$ to present a corrected signal, represented by response curve 26 in FIG. 1. Response curve 26 maintains a substantially linear relation between input voltage $V_{IN}$ and output voltage $V_{OUT}$ to an input voltage level $V_2$ greater than input voltage $V_1$.

Distortion compensation devices, such as predistortion devices, in communication equipment such as telecommunication equipment seek to identify distortion caused by an amplifier circuit and feed back the identified distortion for compensating the identified distortion, as by subtracting the correcting or compensating signal from signals provided to the amplifier circuit. Conventional predistortion signal handling devices are not able to timely establish a compensating response curve 24 to correct for or otherwise accommodate changes in the response of the predistortion signal handling device that happen relatively quickly. Such a latent delay in signal correction is at least partly caused by effecting the required correction using signal treatment off-line in software-executing circuitry. Such off-line software treatment contributes to slow adaptation time as compared with the period of the signal being treated, such as a radio frequency (RF) signal, in a communication system.

Figure 2:
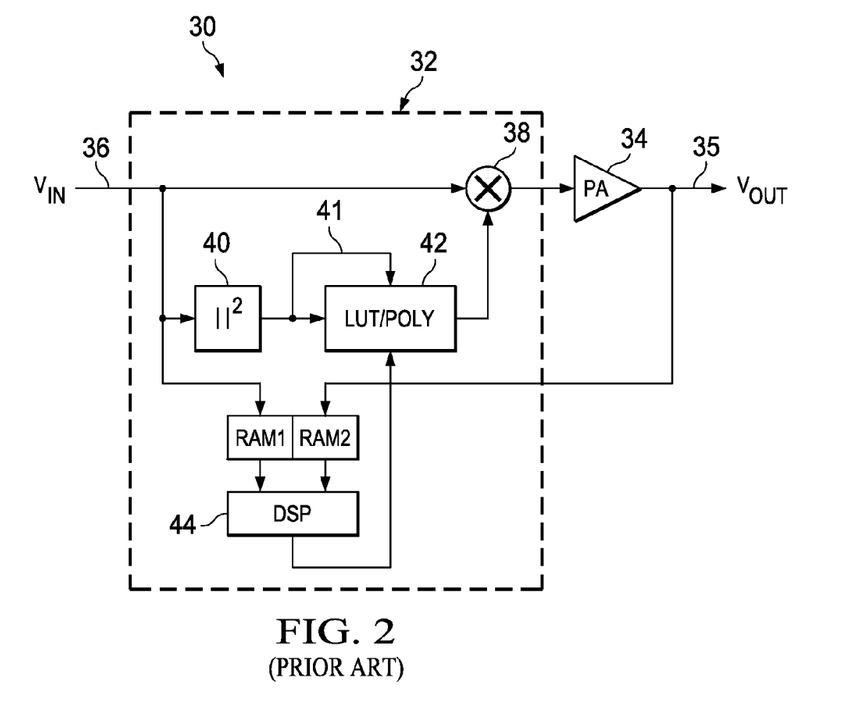
FIG. 2 is a schematic diagram of a first representative conventional distortion correcting device.

FIG. 2 is a schematic diagram of a first representative conventional distortion correcting device. In FIG. 2, a distortion correcting device 30 includes a distortion correcting section 32 and a power amplifier unit 34. Distortion correcting section 32 receives an input signal $V_{IN}$ at an input node 36. Input signal $V_{IN}$ is provided to a combining node 38, to a signal magnitude detecting unit 40 and to a memory device RAM1. Magnitude detecting device 40 provides a magnitude indicating signal to a nonlinear device 42. Magnitude detecting device 40 may provide multi-dimensional magnitude indicating information to a nonlinear device 42 as indicated by a line 41. Nonlinear device 42 may be embodied in a look up table unit (LUT) or in a polynomial expression processing unit (POLY) or in another programmable nonlinear device known in the art. Nonlinear device 42 provides a distortion correction signal to combining node 38. Combining node 38 employs input signal $V_{IN}$ from input node 36 and the distortion correction signal from nonlinear device 42 to present a corrected input signal to power amplifier unit 34. Power amplifier unit 34 presents an output signal $V_{OUT}$ at an output node 35.

Output signal $V_{OUT}$ is provided from output node 35 to a memory device RAM2. Memory devices RAM1, RAM2 are coupled to a processing unit such as a digital signal processor (DSP) 44. RAM1, RAM2 and DSP 44 cooperate to act as an adaptive unit to reduce differences between input signal $V_{IN}$ and output signal $V_{OUT}$. DSP 44 uses information relating to input signal $V_{IN}$ from memory device RAM1 and correction indication information relating to output signal $V_{OUT}$ from memory RAM2 to provide parameters to nonlinear device 42 to correct signal received from output node 35 using some known adaptive algorithm. Exemplary tools for adaptively minimizing an error, the square of an error or to minimize a peak error include but are not limited to least mean squares, least squares, recursive least squares and Kalman filters. The correcting signal relates to differences between output signal $V_{OUT}$ and input signal $V_{IN}$ based upon the assumption that the signals $V_{IN}$, $V_{OUT}$ should be substantially equal, allowing for scaling or other differences. Undesired differences between signals $V_{IN}$, $V_{OUT}$ must have been introduced by distortion correcting device 30 and are sought to be cancelled by the correcting signal provided by nonlinear device 42 to summing node 38 Nonlinear device 42 employs the correcting signal from DSP 44 and the magnitude indicating signal from magnitude detecting device 40 to present the distortion correction signal to combining node 38.

Conventional distortion correcting device 30 is known to work reasonably well to reduce differences between signals $V_{IN}$, $V_{OUT}$ by about 10-15 dB. Further reduction of differences between signals $V_{IN}$, $V_{OUT}$ is difficult because of memory effects in distortion correcting device 30. Nonlinear device 42 functions not only based upon what is currently occurring, but also based in part on a function of what has occurred in the past. There are some hysteresis effects involved in calculations performed by nonlinear device 42 that impede providing an immediate response to extant conditions.

Figure 3:
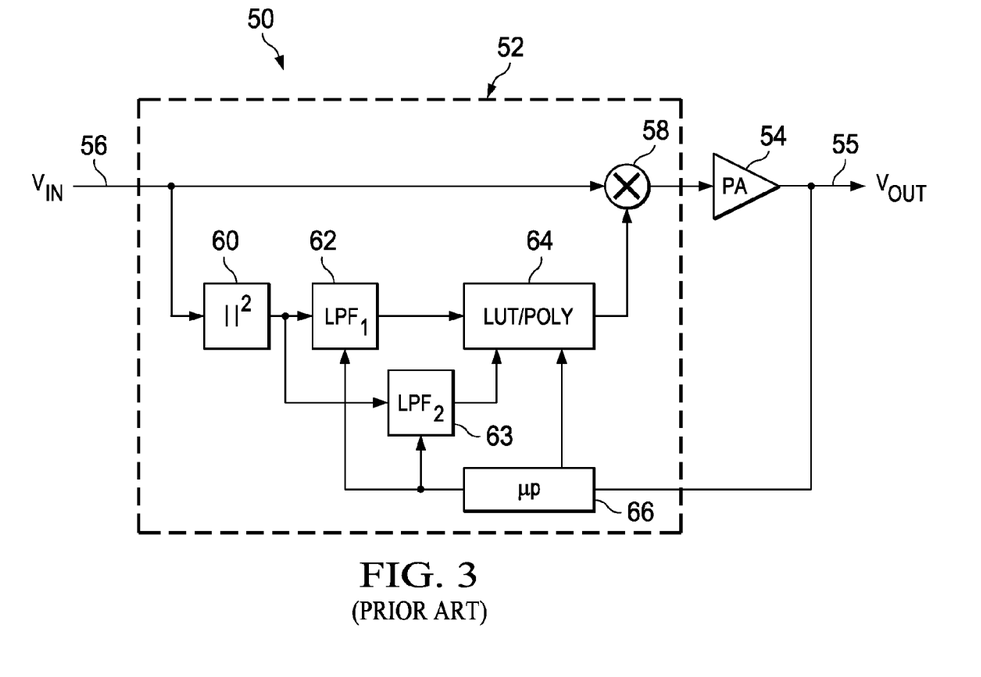
FIG. 3 is a schematic diagram of a second representative conventional distortion correcting device.

FIG. 3 is a schematic diagram of a second representative conventional distortion correcting device. In FIG. 3, a distortion correcting device 50 includes a distortion correcting section 52 and a power amplifier unit 54. Distortion correcting section 52 receives an input signal $V_{IN}$ at an input node 56.

Input signal $V_{IN}$ is provided to a combining node 58 and to a signal magnitude detecting unit 60. Magnitude detecting device 60 provides a magnitude indicating signal to a low pass filter ($LPF_1$) 62. Magnitude detecting device 60 may also provide multi-dimensional magnitude indicating information to a low pass filter ($LPF_2$) 63. $LPF_1$ 62 and $LPF_2$ 63 (if employed) provide filtered magnitude indicating signals to a nonlinear device 64. Nonlinear device 64 may be embodied in a look up table unit (LUT) or in a polynomial expression processing unit (POLY) or in another nonlinear device known in the art that can accept multiple inputs. Nonlinear device 64 provides a distortion correction signal to combining node 58. Combining node 58 provides a corrected input signal to power amplifier unit 54. Power amplifier unit 54 presents an output signal $V_{OUT}$ at an output node 55. Output signal $V_{OUT}$ is provided from output node 55 to a processor unit 66 directly or via one or more memory devices, such as memory devices RAM1, RAM2 (FIG. 2). Processor unit 66 is preferably embodied in a microprocessor device and uses information relating to output signal $V_{OUT}$ from output node 55 with, by way of example and not by way of limitation, information relating to the temperature and active regions of devices (e.g., transistors) used in distortion correcting device 50 to provide adaptive parameters to $LPF_1$ 62, $LPF_2$ 63 (if employed) and nonlinear device 64. $LPF_1$ 62 and $LPF_2$ 63 (if employed) incorporate the feedback signals received from processor unit 66 to present the filtered magnitude indicating signals provided to nonlinear device 64. Processor unit 66 may also provide a feedback signal to nonlinear device 64 indicating difference an aspect of output signal $V_{OUT}$. Nonlinear device 64 employs the indicating signals from $LPF_1$ 62, $LPF_2$ 63 (if employed) and processor unit 66 to create a correcting signal relating to differences between output signal $V_{OUT}$ and input signal $V_{IN}$ based upon the assumption that the signals $V_{IN}$, $V_{OUT}$ should be substantially equal, allowing for scaling or other differences. Undesired differences between signals $V_{IN}$, $V_{OUT}$ must have been introduced by distortion correcting device 50 and are sought to be cancelled by the correcting signal provided by nonlinear device 64 to combining node 58.

Distortion correcting device 50 is limited in its capability to model every event that may affect its operation. It is difficult to model many events such as, by way of example and not by way of limitation, power supply disturbances and air conditioning effects on temperature and on power supply operation. In conventional distortion correcting devices such as distortion correcting device 50, software in processing unit 66 is programmed to update events relating to some two thousand complex operating variables approximately every 100 milliseconds. A natural result is that operation of distortion correcting device 50 is relatively slow, especially in comparison to the speed of signals employed in RF communication systems.

There is a need for a faster response time in monitoring fault conditions and other conditions in distortion correcting systems such as predistortion correcting devices, especially in RF communication systems.

Figure 4:
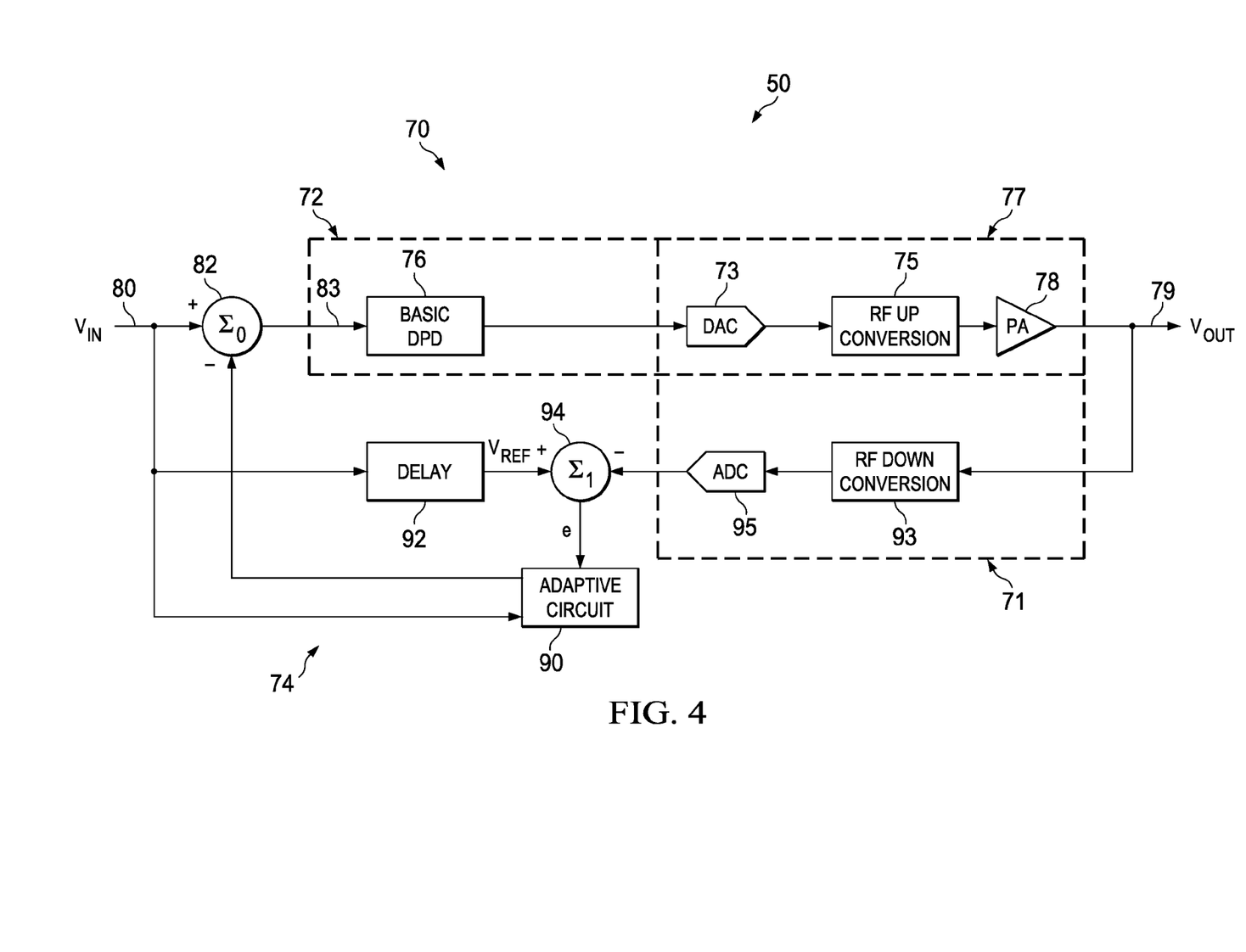
FIG. 4 is a schematic diagram of a first embodiment of a supplemental or additional response apparatus configured according to the present invention.

Turning to FIG. 4, an example of a circuit 50 in accordance with a preferred embodiment of the present invention can be seen. Circuit 50 generally comprises distortion correcting circuits 70 and 74. Distortion correcting circuit 70 includes a distortion correcting device 72 and a supplemental correcting device 74. Distortion correcting device 72 includes a distortion correcting section 76 and a power amplifier 78. In the embodiment illustrated in FIG. 4, power amplifier 78 is included in an output section 77. Output section 77 also includes a digital-to-analog converter (DAC) 73 and an RF up-converting unit 75. Output section 77 couples distortion correcting device 72 with an output node 79. A feedback section 71 couples output node 79 with supplemental correcting device 74. Feedback section 71 includes an RF down-converting unit 93 and an analog-to-digital converter (ADC) 95.

Distortion correcting section 76 may be configured substantially as one of distortion correcting section 32 (FIG. 2) or distortion correcting section 52 (FIG. 3) or another distortion correcting section. Supplemental correcting device 74 includes an adaptive circuit 90, a reference unit 92 and a summing node 94. Distortion correction apparatus 70 thus occupies a digital realm 86 and an analog realm 88. Adaptive circuit 90 may also be configured substantially as one of distortion correcting section 32 (FIG. 2) or distortion correcting section 52 (FIG. 3) or another adaptive circuit.

Distortion correcting device 72 receives an input signal $V_{IN}$ at an input node 80. Input signal $V_{IN}$ is provided to a summing node 82, to reference unit 92 and to adaptive circuit 90. Reference unit 92 imposes a delay to input signal $V_{IN}$ and delivers a reference signal $V_{REF}$ to summing node 94. $V_{REF}$ may be embodied in a delayed input signal $V_{IN-D}$. Summing node 94 also receives a feedback signal from output node 79 via feedback section 71 that is related to output signal $V_{OUT}$. Summing node 94 combines reference signal $V_{REF}$ with the feedback signal received from output node 79 to present an error signal e to adaptive device 90. Adaptive device 90 may be included in a look up table unit (LUT) or in a polynomial expression processing unit (POLY) or in another nonlinear device known in the art. Adaptive device 90 provides a high speed-related correction signal to summing node 82. Summing node 82 provides a high speed-related corrected input signal to distortion correcting device 72 at a correcting input node 83. Error signal e indicates an aggregate error for distortion correcting device 72 when high speed-related correction is provided at summing node 82 and slow speed-related correction is provided by distortion correcting section 76.

Adaptive device 90 employs error signal e based upon the assumption that the signals $V_{IN}$, $V_{OUT}$ should be substantially equal, allowing for scaling or other differences. Undesired differences between signals $V_{IN}$, $V_{OUT}$ are presumed to have been introduced by imperfections in distortion correcting device 72. High speed-related differences are sought to be cancelled by the high speed-related correcting signal provided by adaptive device 90 to summing node 82. Slow speed-related differences are sought to be cancelled by distortion correcting section 76, generally as described in connection with FIGS. 2 and 3.

As illustrated in FIG. 4, supplemental correcting device 74 my be coupled to a conventional distortion correcting device having a relatively imperfect correction and treat signals provided to the slow conventional device using circuitry having a faster response time. By treating the conventional correcting device as a "black box" containing a slow speed-related correcting device and a power amplifier unit, one simplifies operational coordination between the high speed-related distortion correction provided by supplemental correcting device 74 and the slow conventional device. In this manner, existing slow-reacting conventional distortion correcting devices may be left in situ and continue to address all of the many factors currently addressed using their existing software off-line calculations and adaptation. The supplemental correcting device of the present invention can address fast-changing parameters and incorporate responses to correct distortion caused by such fast-changing parameters in the input signal provided to the conventional distortion correcting device. In such manner, both high speed-related distortion and slow speed-related distortion are incorporated in signals provided to the power amplifier of the conventional distortion correcting device. One difference between distortion correcting section 76 and supplemental correcting device 74 is that distortion correcting section 76 is adapted using a relatively slow microprocessor, but supplemental correcting device 74 can operate using fast and comparatively simple adaptation that can be implemented in dedicated hardware.

Figure 5:
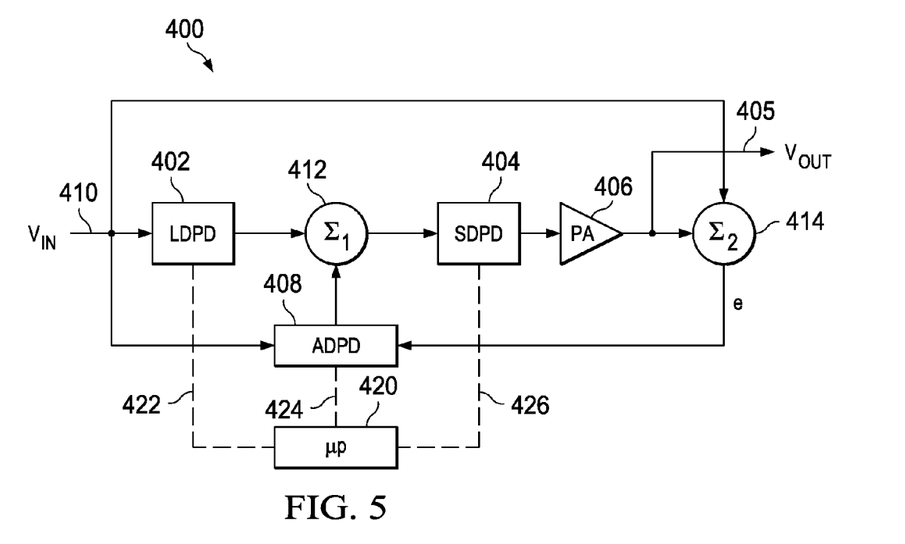
FIG. 5 is a schematic diagram of a system in which the apparatus and method of the present invention may be advantageously employed.

FIG. 5 is a schematic diagram of a system in which the apparatus and method of the present invention may be advantageously employed. In FIG. 5, a distortion correcting system 400 is includes a long-term digital predistortion device (LDPD) 402, a short-term digital predistortion device (SDPD) 404, a power amplifier unit 406 and an adaptive digital predistortion device (ADPD) 408. By way of example and not by way of limitation, SDPD 404 may exhibit a response characteristic capable of correcting distortion having a duration on the order of one microsecond (µsec) or less, LDPD 408 may exhibit a response characteristic capable of correcting distortion having a duration on the order of 100 µsec or more and ADPD 408 may exhibit a response characteristic capable of correcting distortion having a duration on the order of one µsec to 100 µsec. By including all of LDPD 402, SDPD 404 and ADPD 408 in distortion correcting system 400 one may expect to handle a wide range of distortion having a wide range of durations.

Distortion correcting system 400 receives an input signal $V_{IN}$ at an input node 410. Input signal $V_{IN}$ is provided to LDPD 402 and to ADPD 408. ADPD 408 provides a long-term adjusted correcting signal to a first combining node ($\Sigma_1$) 412. SDPD 404 receives a partially-adjusted correcting signal from first combining node 412 and provides a further adjusted correcting signal to power amplifier unit 406.

Power amplifier unit 406 presents an output signal $V_{OUT}$ at an output node 405. Output signal $V_{OUT}$ is provided from output node 405 to ADPD 408. ADPD 408 provides an adaptive intermediate-term adjusted correcting signal to second combining node 414. Second combining node 414 uses the intermediate-term adjusted correcting signal from ADPD 408 and the long-term adjusted correcting signal from LDPD 402 in developing the partially-adjusted correcting signal to SDPD 404. SDPD 404 employs the partially-adjusted correction signal received from second combining node 414 to develop the signal provided to power amplifier unit 406 as a fully-adjusted correcting signal reflecting long-term correcting adjustments from LDPD 402, intermediate-term correcting adjustments from ADPD 408 and short-term correcting adjustments developed by SDPD 404. A control device 420 preferably embodied in a microprocessor device effects control of distortion correcting system 400, as indicated by dotted lines 422, 424, 426.

Distortion correcting system 400 creates a fully-adjusted correcting signal relating to differences between output signal $V_{OUT}$ and input signal $V_{IN}$ based upon the assumption that the signals $V_{IN}$, $V_{OUT}$ should be substantially equal, allowing for scaling or other differences. Undesired differences between signals $V_{IN}$, $V_{OUT}$ must have been introduced by distortion correcting system 400 and are sought to be cancelled by distortion correcting system 400.

Figure 6:
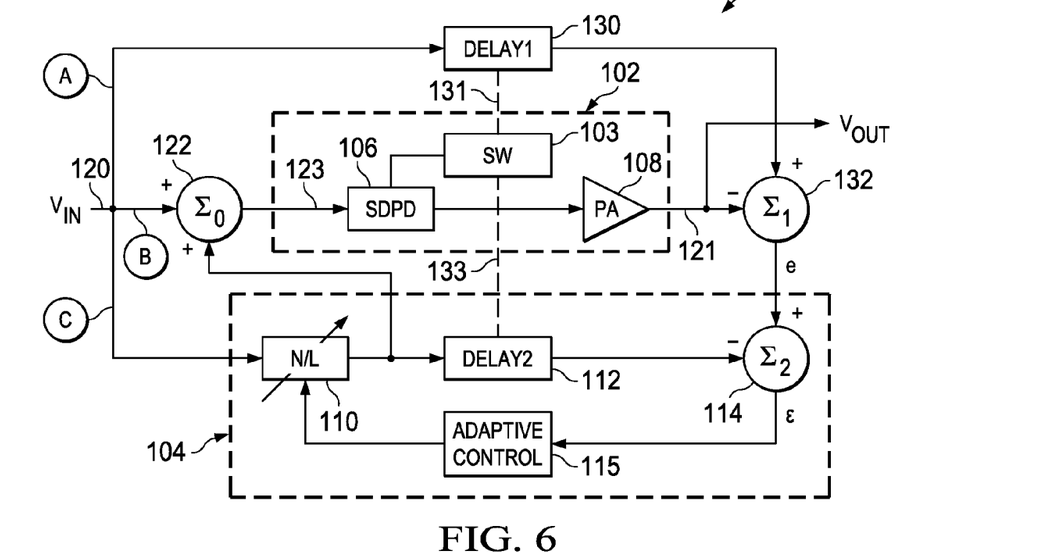
FIG. 6 is a schematic diagram of a second embodiment of a supplemental or additional response apparatus configured according to the present invention.

FIG. 6 is a schematic diagram of a second embodiment of a supplemental or additional response apparatus configured according to the present invention. In FIG. 6, a distortion correcting apparatus 100 is configured as a predistortion device including a distortion correcting device 102 and a supplemental correcting device 104. Distortion correcting device 102 includes a distortion correcting section 106 and a power amplifier 108. Distortion correcting section 106 operates in conjunction with software 103. Distortion correcting section 106 may be configured substantially as one of distortion correcting section 32 (FIG. 2) or distortion correcting section 52 (FIG. 3) or another distortion correcting section. Supplemental correcting device 104 includes an adaptive circuit 110, a delay unit 112 and a summing node 114.

Distortion correcting apparatus 100 receives an input signal $V_{IN}$ at an input node 120. Input signal $V_{IN}$ is provided to a summing node 122, to a delay unit 130 and to adaptive circuit 110. Delay unit 130 preferably imposes a delay to input signal $V_{IN}$ substantially equal with a delay imposed on input signal $V_{IN}$ by distortion correcting device 102 and delivers a delayed input signal $V_{IN-D}$ to a summing node 132. Summing node 132 also receives output signal $V_{OUT}$ at an output node 121 from distortion correcting device 102. Summing node 132 combines output signal $V_{OUT}$ with delayed input signal $V_{IN-D}$ to present an error signal e to summing node 114. Error signal e indicates an error relating to a difference between delayed input signal $V_{IN-D}$ and output signal $V_{OUT}$ at summing node 132. Error signal e indicates an aggregate error for distortion correcting device 102 when high speed-related correction is provided at summing node 122 and slow speed-related correction is provided by distortion correcting section 106.

Supplemental correction device 104 effects removal of the delay factor from error signal e in order to apply a high speed correction signal to summing node 122 for carrying out high speed-related distortion correction of signals provided to distortion correcting device 102. Adaptive device 110 may be embodied in a look up table unit (LUT) or in a polynomial expression processing unit (POLY) or in another adaptive device known in the art. Delay unit 112 provides substantially the same delay to received signals as the delay provided by delay unit 130. Summing node 114 receives error signal e from summing node 132. Summing node 114 subtracts the delay interval imposed by delay unit 112 so that summing node 114 provides a time-adjusted error signal $\epsilon$ to adaptive circuit 110 that is substantially in phase with input signal $V_{IN}$ arriving at summing node 122 from input node 120. As mentioned previously, the various delay intervals provided by delay units 112, 130 and by distortion correction device 102 are preferably substantially the same interval. Preferably, software 103 is enabled to adjust delay intervals imposed by delay units 112, 130 as indicated by dotted lines 131, 133 to ensure that the various phase or timing relations among signals in distortion correcting apparatus 100 are properly maintained for proper operation of distortion correcting apparatus 100.

Adaptive device 110 uses time-adjusted error signal $\epsilon$ to provide a high speed-related distortion correction signal to summing node 122. Summing node 122 provides a high speed-related corrected input signal to distortion correcting device 102 at a correcting input node 123.

Distortion correcting apparatus 100 employs error signals e, $\epsilon$ based upon the assumption that signals $V_{IN}$, $V_{OUT}$ should be substantially equal, allowing for scaling differences, timing differences or other differences. Undesired differences between signals $V_{IN}$, $V_{OUT}$ are presumed to have been introduced by distortion correcting device 102. High speed-related differences are sought to be cancelled by the high speed-related correcting signal provided by supplementary correction device 104 to summing node 122. Slow speed-related differences are sought to be cancelled by distortion correcting section 106, generally as described in connection with FIGS. 2 and 3.

As illustrated in FIG. 6, supplemental correcting device 104 may be coupled to a conventional distortion correcting device having a relatively slow speed of reaction, and treat signals provided to the slow conventional device using circuitry having a faster response time. By treating the conventional correcting device as a "black box" containing a slow speed-related correcting device and a power amplifier unit, one simplifies operational coordination between the high speed-related distortion correction provided by supplemental correcting device 104 and the slow conventional device. In this manner, existing slow-reacting conventional distortion correcting devices may be left in situ and continue to address all of the many factors currently addressed using their existing software off-line calculations. The supplemental correcting device of the present invention can address fast-changing parameters and incorporate responses to correct distortion caused by such fast-changing parameters in the input signal provided to the conventional distortion correcting device. In such manner, both high speed-related distortion and slow speed-related distortion are incorporated in signals provided to the power amplifier of the conventional distortion correcting device. Digital predistortion devices 402, 404, 408 (FIG. 5) may be arranged in any relative arrangement that permits presenting a fully-adjusted corrected signal to power amplifier unit 406. It is for this reason that one skilled in the art of the present invention should understand that signals received at loci A, B and C in distortion correcting apparatus 100 may not necessarily be received from a common source as is representatively indicated in FIG. 6.

Figure 7:
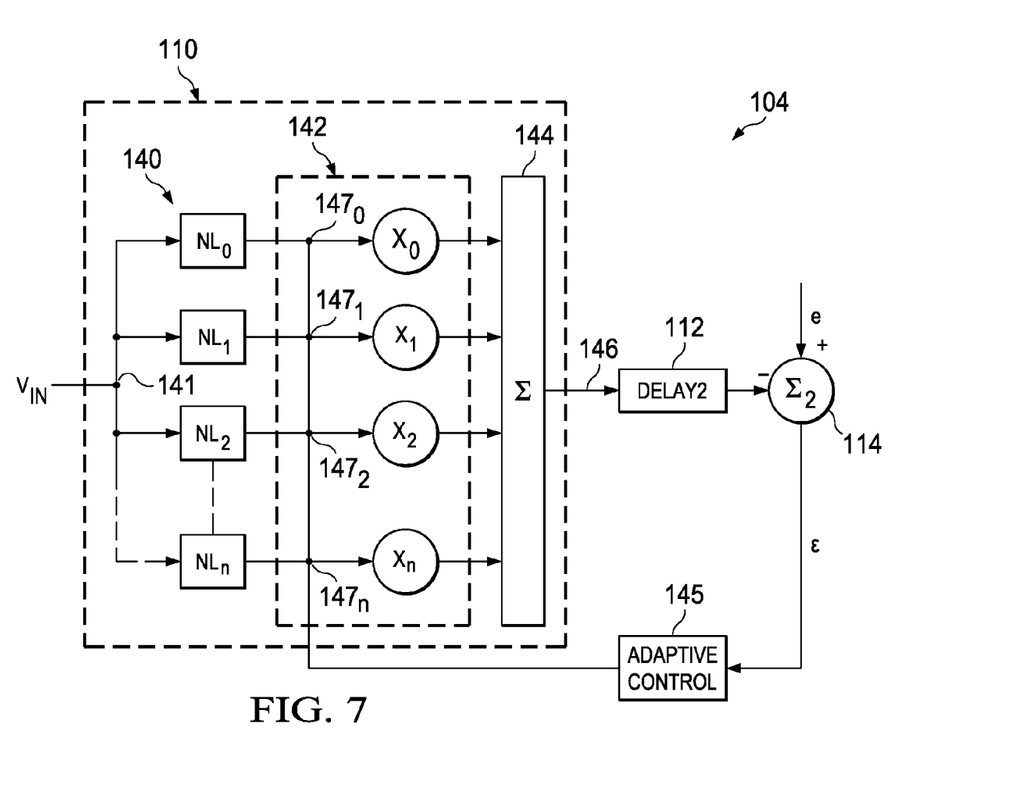
FIG. 7 is a schematic diagram of a representative adaptive circuit for use with a supplemental or additional response apparatus configured according to the present invention.

FIG. 7 is a schematic diagram of a representative adaptive circuit for use with a supplemental or additional response apparatus configured according to the present invention. In FIG. 7, an adaptive circuit 104 includes an adaptive circuit 110, a delay unit 112 and a summing node 114, substantially as described in detail in connection with FIG. 6. Adaptive circuit 104 is configured for performing least mean square, least square or similar calculations to reduce differences between input signal $V_{IN}$ and time-adjusted error signal $\epsilon$.

Adaptive circuit 110 includes a non-linear calculating section 140, a weighting section 142 and a summing unit 144. Non-linear calculating section 140 includes a plurality of non-linear calculating units $NL_0, NL_1, NL_2, \ldots NL_n$. Weighting section 142 includes a plurality of weighting units $X_0, X_1, X_2, \ldots X_n$. The indicator "n" is employed to signify that there can be any number of calculating units and weighting units in adaptive circuit 110. The inclusion of four calculating units $NL_0, NL_1, NL_2, \ldots NL_n$ and four weighting units $X_0, X_1, X_2, \ldots X_n$ in FIG. 7 is illustrative only and does not constitute any limitation regarding the number of calculating units and weighting units that may be included in the adaptive circuit of the present invention.

Input signal $V_{IN}$ is coupled for input to an input node 141 coupled to each of calculating units $NL_0, NL_1, NL_2, \ldots NL_n$. Each respective calculating unit $NL_n$ is coupled for operation with a respective weighting unit $X_n$. Weighted calculation results are provided from weighting section 142 to summing unit 144. An aggregate weighted result is presented at an output node 146 for input to delay unit 112 and subsequent use by summing node 114, substantially as described above in connection with FIG. 6. Time-adjusted error signal $\epsilon$ is provided to an adaptive control unit 145. Adaptive control unit 145 develops weight factors for each weighting unit $X_0, X_1, X_2, \ldots X_n$ and provides a respective weight values for use by each respective weighting unit $X_0, X_1, X_2, \ldots X_n$ at a respective node $147_0, 147_1, 147_2, 147_n$.

The embodiment of adaptive circuit 104 illustrated in FIG. 7 is illustrative only and does not limit what non-linear error reducing calculation approach, apparatus or method may be employed in the present invention. By way of further example and not by way of limitation, adaptive circuit 104 may employ any method, apparatus or approach that identifies a number of regressors and weights the regressors to minimize the error, or differences, among the regressors. Exemplary tools for adaptively minimizing an error, the square of an error or to minimize a peak error include but are not limited to least mean squares, least squares, recursive least squares and Kalman filters.

Figure 8:
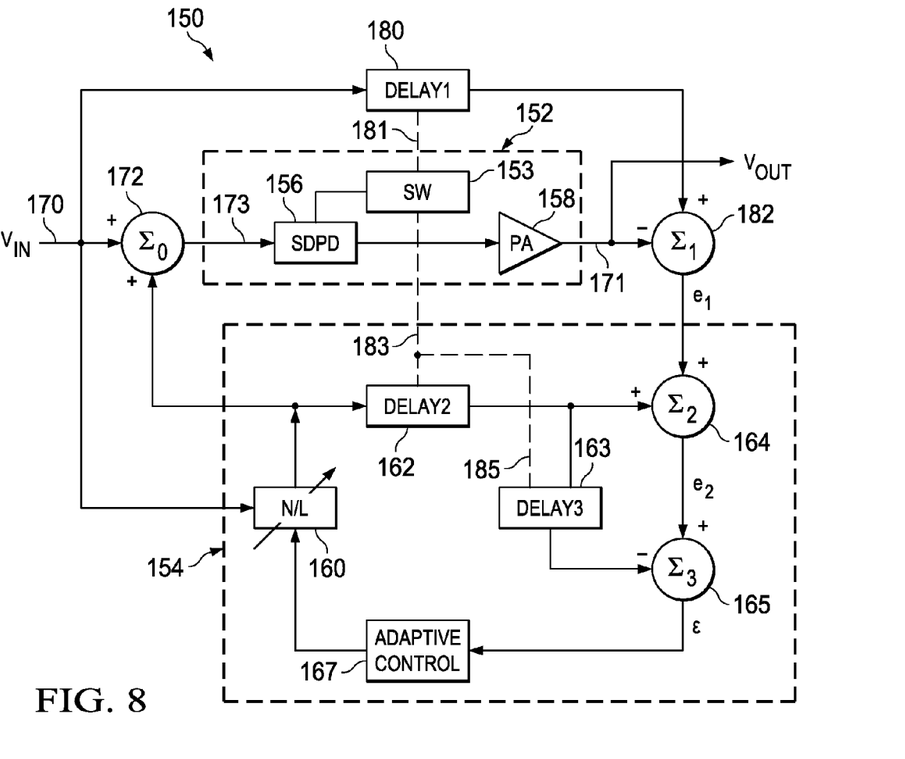
FIG. 8 is a schematic diagram of a third embodiment of a supplemental or additional response apparatus configured according to the present invention.

FIG. 8 is a schematic diagram of a third embodiment of a supplemental or additional response apparatus configured according to the present invention. In FIG. 8, a distortion correcting apparatus 150 is configured as a predistortion device including a distortion correcting device 152 and a supplemental correcting device 154. Distortion correcting device 152 includes a distortion correcting section 156 and a power amplifier 158. Distortion correcting section 152 operates in conjunction with software 153. Distortion correcting section 156 may be configured substantially as one of distortion correcting section 32 (FIG. 2) or distortion correcting section 52 (FIG. 3) or another distortion correcting section. Supplemental correcting device 154 includes an adaptive circuit 160, delay unit 162 and summing nodes 164, 165. A delay unit 163 may also be included in supplemental correcting device 154, as indicated by the dotted line rendition of delay unit 163.

Distortion or correcting apparatus 150 receives an input signal $V_{IN}$ at an input node 170. Input signal $V_{IN}$ is provided to a summing node 172, to adaptive circuit 160 and to a delay unit 180. Delay unit 180 preferably imposes a delay to input signal $V_{IN}$ substantially equal with a delay imposed on input signal $V_{IN}$ by distortion correcting device 152 and delivers a delayed input signal $V_{IN-D}$ to a summing node 182.

Summing node 182 also receives output signal $V_{OUT}$ at an output node 171 from distortion correcting device 152. Summing node 182 combines output signal $V_{OUT}$ with delayed input signal $V_{IN-D}$ to present an error signal $e_1$ to summing node 164. Error signal $e_1$ indicates an error relating to a difference between delayed input signal $V_{IN-D}$ and output signal $V_{OUT}$ at summing node 182. Error signal $e_1$ indicates an aggregate error for distortion correcting device 152 when high speed-related distortion correction is provided at summing node 172 and slow speed-related distortion correction is provided by distortion correcting section 156.

Distortion correcting apparatus 150 seeks to reduce error signal $e_1$ to zero. In a distortion correcting apparatus configured as distortion correcting apparatus 100 (FIG. 6), as error signal e is at or near a zero value a false correcting result or a dithering correction effect may occur in determining a time-adjusted error signal $\epsilon$, as at summing node 114 (FIG. 6). Distortion correcting apparatus 150 avoids permitting an error signal for correction to approach a zero value by adding a delay back into error signal $e_1$ using summing node 164. Delay unit 162 adds a delay to high speed-related corrected signals from adaptive circuit 160. The signal provided by delay unit 162 is a high speed-related corrected signal from adaptive unit 160 plus a delay interval. Summing node 164 employs signals from delay unit 162 with error signal $e_1$ to present an evaluation error signal $e_2$. In such an arrangement, error signal $e_1$ is prevented from approaching a zero value.

Supplemental correction device 154 effects removal of the delay factor from evaluation error signal $e_2$ by subtracting at summing node 165 the delay signal imposed by delay unit 162 via summing node 164. The delay signal applied to summing node 165 may be directly applied from delay unit 164 or, alternatively, delay unit 163 may be employed to assure timely application of the requisite delay signal for subtraction or removal from evaluation error signal $e_2$. The alternative nature of employing delay unit 163 is indicated by the dotted line rendition of delay unit 163 in FIG. 8.

Summing node 165 receives evaluation error signal $e_2$ from summing node 164. Summing node 165 subtracts the delay interval imposed by delay unit 162 so that summing node 165 provides a time-adjusted error signal $\epsilon$ to adaptive circuit 160 that is substantially in phase with input signal $V_{IN}$ arriving at summing node 172 from input node 170. As mentioned previously, the various delay intervals provided by delay units 162, 163 (if employed) 180 and by distortion correction device 152 are preferably substantially the same interval. Preferably, software 153 is enabled to adjust delay intervals imposed by delay units 162, 163 (if employed) 180 as indicated by dotted lines 181, 183, 185 to ensure that the various phase or timing relations among signals in distortion correcting apparatus 150 are properly maintained for proper operation of distortion correcting apparatus 150.

Adaptive device 160 uses time-adjusted error signal $\epsilon$ to provide a high speed-related distortion correction signal to summing node 172 and to delay unit 162. Summing node 172 provides a high speed-related corrected input signal to distortion correcting device 152 at a correcting input node 173. Adaptive device 160 may be embodied in a look up table unit (LUT) or in a polynomial expression processing unit (POLY) or in another adaptive device known in the art.

Distortion correcting apparatus 150 employs error signals $e_1$, $e_2$, $\epsilon$ based upon the assumption that the signals $V_{IN}$, $V_{OUT}$ should be substantially equal, allowing for scaling differences, timing differences or other differences. Undesired differences between signals $V_{IN}$, $V_{OUT}$ are presumed to have been introduced by distortion correcting device 152. High speed-related differences are sought to be cancelled by the high speed-related correcting signal provided by supplementary correction device 154 to summing node 172. Slow speed-related differences are sought to be cancelled by distortion correcting section 156, generally as described in connection with FIGS. 2 and 3.

As illustrated in FIG. 8, supplemental correcting device 154 may be coupled to a conventional distortion correcting device having a relatively slow speed of reaction, and treat signals provided to the slow conventional device using circuitry having a faster response time. By treating the conventional correcting device as a "black box" containing a slow speed-related correcting device and a power amplifier unit, one simplifies operational coordination between the high speed-related distortion correction provided by supplemental correcting device 154 and the slow conventional device. In this manner, existing slow-reacting conventional distortion correcting devices may be left in situ and continue to address all of the many factors currently addressed using their existing software off-line calculations. The supplemental correcting device of the present invention can address fast-changing parameters and incorporate responses to correct distortion caused by such fast-changing parameters in the input signal provided to the conventional distortion correcting device. In such manner, both high speed-related distortion and slow speed-related distortion are incorporated in signals provided to the power amplifier of the conventional distortion correcting device.

Figure 9:
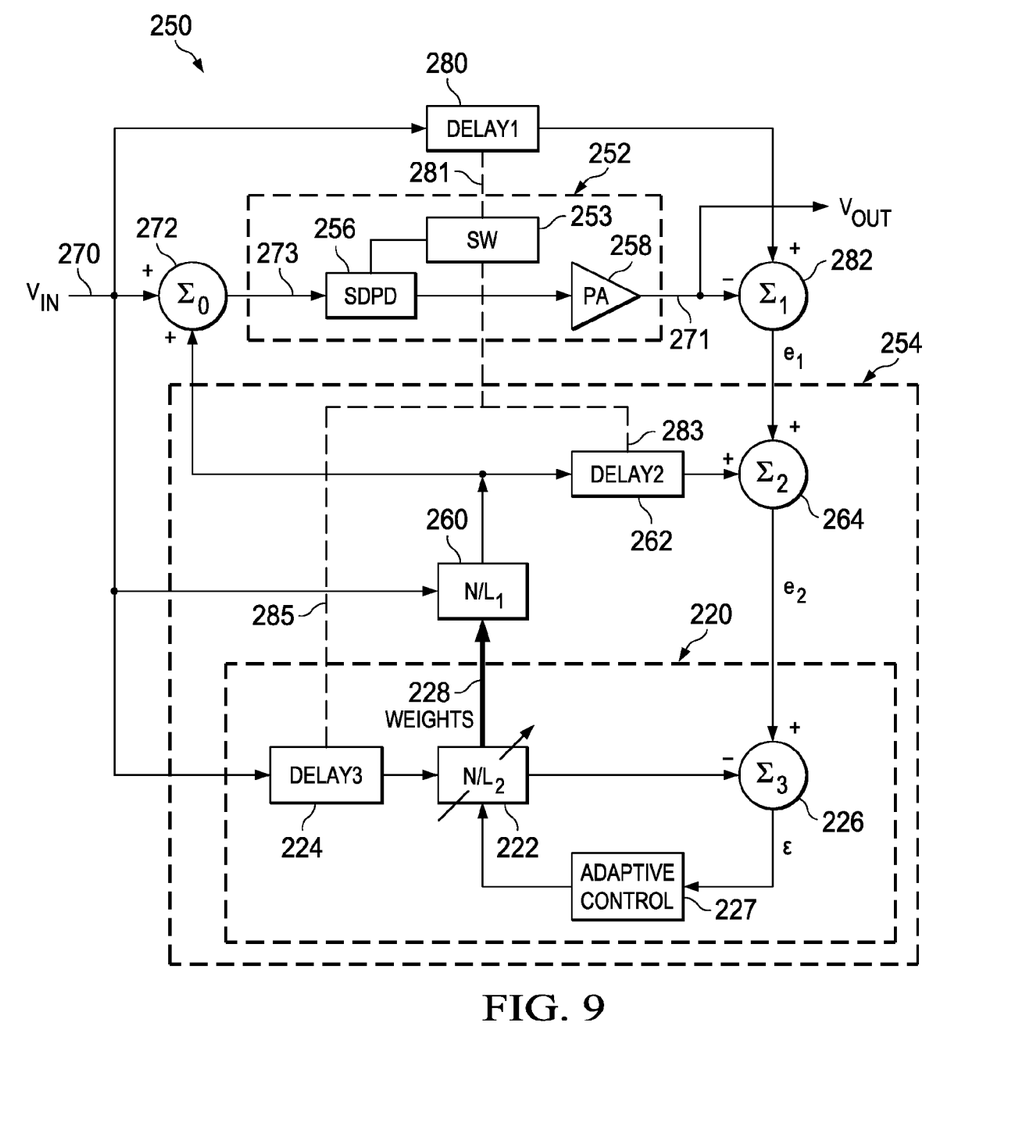
FIG. 9 is a schematic diagram of a fourth embodiment of a supplemental or additional response apparatus configured according to the present invention.

FIG. 9 is a schematic diagram of a fourth embodiment of a supplemental or additional response apparatus configured according to the present invention. In FIG. 9, a distortion correcting apparatus 250 is configured as a predistortion device including a distortion correcting device 252 and a supplemental correcting device 254. Distortion correcting device 252 includes a distortion correcting section 256 and a power amplifier 258. Distortion correcting section 252 operates in conjunction with software 253. Distortion correcting section 256 may be configured substantially as one of distortion correcting section 32 (FIG. 2) or distortion correcting section 52 (FIG. 3) or another distortion correcting section. Supplemental correcting device 254 includes a non-linear calculating unit 260, delay unit 262, a summing node 264 and an initial evaluating section 220.

Initial evaluating section 220 includes an adaptive unit 222, a delay unit 224 and a summing unit 226. Initial evaluating section 220 may be implemented in hardware, in software or in a combination of hardware and software. In its preferred embodiment, initial evaluating section 220 is implemented in software.

Distortion correcting apparatus 250 receives an input signal $V_{IN}$ at an input node 270. Input signal $V_{IN}$ is provided to a summing node 272 and to delay units 224, 280. Delay unit 280 preferably imposes a delay to input signal $V_{IN}$ substantially equal with a delay imposed on input signal $V_{IN}$ by distortion correcting device 252 and delivers a delayed input signal $V_{IN\text{-}D}$ to a summing node 282.

Summing node 282 also receives output signal $V_{OUT}$ at an output node 271 from distortion correcting device 252. Summing node 282 combines output signal $V_{OUT}$ with delayed input signal $V_{IN\text{-}D}$ to present an error signal $e_1$ to summing node 264. Error signal $e_1$ indicates an error relating to a difference between delayed input signal $V_{IN\text{-}D}$ and output signal $V_{OUT}$ at summing node 282. Error signal $e_1$ indicates an aggregate error for distortion correcting device 252 when high speed-related distortion correction is provided at summing node 272 and slow speed-related distortion correction is provided by distortion correcting section 256.

Distortion correcting apparatus 250 seeks to reduce error signal $e_1$ to zero. In a distortion correcting apparatus configured as distortion correcting apparatus 100 (FIG. 6), as error signal e is at or near a zero value a false correcting result or a dithering correction effect may occur in determining a time-adjusted error signal $\epsilon$, as at summing node 114 (FIG. 6). Distortion correcting apparatus 250 avoids permitting an error signal for correction to approach a zero value by adding a delay back into error signal $e_1$ using summing node 264. Delay unit 262 adds a delay to high speed-related corrected signals from adaptive circuit 260. The signal provided by delay unit 262 is a high speed-related corrected signal from adaptive unit 260 plus a delay interval. Summing node 264 employs signals from delay unit 262 with error signal $e_1$ to present an evaluation error signal $e_2$. In such an arrangement, error signal $e_1$ is prevented from approaching a zero value.

Supplemental correction device 254 employs initial evaluating section 220 to effect removal of the delay factor from evaluation error signal $e_2$ by subtracting a delayed high speed-related corrected signal from adaptive unit 222 at summing unit 226. The delayed high speed-related corrected signal from adaptive unit 222 is delayed by an interval introduced at delay unit 224. The high speed-related corrected signal from adaptive unit 222 is substantially in phase with the delay signal imposed by delay unit 262 via summing node 264.

Summing unit 226 receives evaluation error signal $e_2$ from summing node 264. Summing unit 226 subtracts the high speed-related corrected signal from adaptive unit 222 so that summing unit 226 provides a time-adjusted error signal $\epsilon$ to adaptive circuit 222 that is substantially in phase with input signal $V_{IN}$ arriving at summing node 272 from input node 270. The various delay intervals provided by delay units 224, 262, 280 and by distortion correction device 252 are preferably substantially the same interval. Preferably, software 253 is enabled to adjust delay intervals imposed by delay units 224, 262, 280 as indicated by dotted lines 281, 283, 285 to ensure that the various phase or timing relations among signals in distortion correcting apparatus 250 are properly maintained for proper operation of distortion correcting apparatus 250.

Adaptive device 222 uses time-adjusted error signal $\epsilon$ to provide a high speed-related corrected signal to summing node 226. Adaptive device 222 may be configured, by way of example and not by way of limitation, substantially similar to adaptive circuit 104 (FIG. 7). Adaptive circuit 222 provides weights (as, for example, from weighting units $X_0$, $X_1$, $X_2$, ... $X_n$; FIG. 7) for use by non-linear calculating unit 260 for use in presenting a high speed-related correcting input signal to summing node 272 and to delay unit 262. Summing node 272 provides a high speed-related corrected input signal to distortion correcting device 252 at a correcting input node 273. Non-linear calculating unit 260 may be embodied in a look up table unit (LUT) or in a polynomial expression processing unit (POLY) or in another non-linear calculating device known in the art.

Distortion correcting apparatus 250 employs error signals $e_1$, $e_2$, $\epsilon$ based upon the assumption that the signals $V_{IN}$, $V_{OUT}$ should be substantially equal, allowing for scaling differences, timing differences or other differences. Undesired differences between signals $V_{IN}$, $V_{OUT}$ are presumed to have been introduced by distortion correcting device 252. High speed-related differences are sought to be cancelled by the high speed-related correcting signal provided by supplementary correction device 254 to summing node 272. Slow speed-related differences are sought to be cancelled by distortion correcting section 256, generally as described in connection with FIGS. 2 and 3.

As illustrated in FIG. 9, supplemental correcting device 254 may be coupled to a conventional distortion correcting device having a relatively slow speed of reaction, and treat signals provided to the slow conventional device using circuitry having a faster response time. By treating the conventional correcting device as a "black box" containing a slow speed-related correcting device and a power amplifier unit, one simplifies operational coordination between the high speed-related distortion correction provided by supplemental correcting device 254 and the slow conventional device. In this manner, existing slow-reacting conventional distortion correcting devices may be left in situ and continue to address all of the many factors currently addressed using their existing software off-line calculations. The supplemental correcting device of the present invention can address fast-changing parameters and incorporate responses to correct distortion caused by such fast-changing parameters in the input signal provided to the conventional distortion correcting device. In such manner, both high speed-related distortion and slow speed-related distortion are incorporated in signals provided to the power amplifier of the conventional distortion correcting device.

Figure 10:
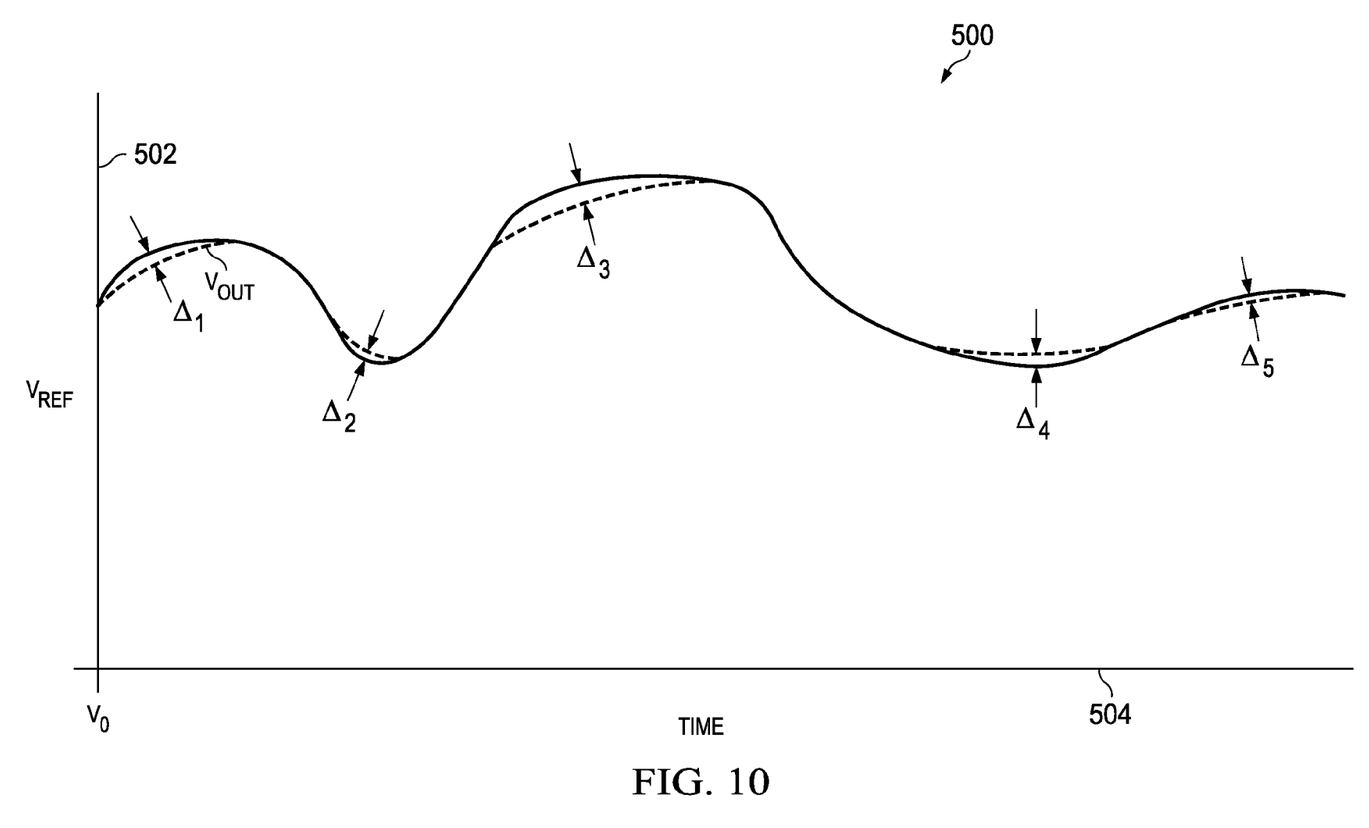
FIG. 10 is a graphical representation of voltage responses of another representative distortion correcting device.

FIG. 10 is a graphical representation of voltage responses of another representative distortion correcting device. In FIG. 10, a graphic representation 500 includes a vertical axis 502 representing output voltage and a horizontal axis 504 representing time. A reference voltage signal $V_{REF}$ represents a desired response to be achieved by an output $V_{OUT}$ from a non-linear device. It may be noted that signal $V_{OUT}$ does not precisely track or match desired signal $V_{REF}$. Differences $\Delta_1$, $\Delta_2$, $\Delta_3$, $\Delta_4$, $\Delta_5$ exist between signals $V_{OUT}$, $V_{REF}$. It is a desirable design goal to have signal $V_{OUT}$ more precisely match reference signal $V_{REF}$. That is, it is desired that differences $\Delta_1$, $\Delta_2$, $\Delta_3$, $\Delta_4$, $\Delta_5$ between signals $V_{OUT}$, $V_{REF}$ be reduced.

Figure 11:
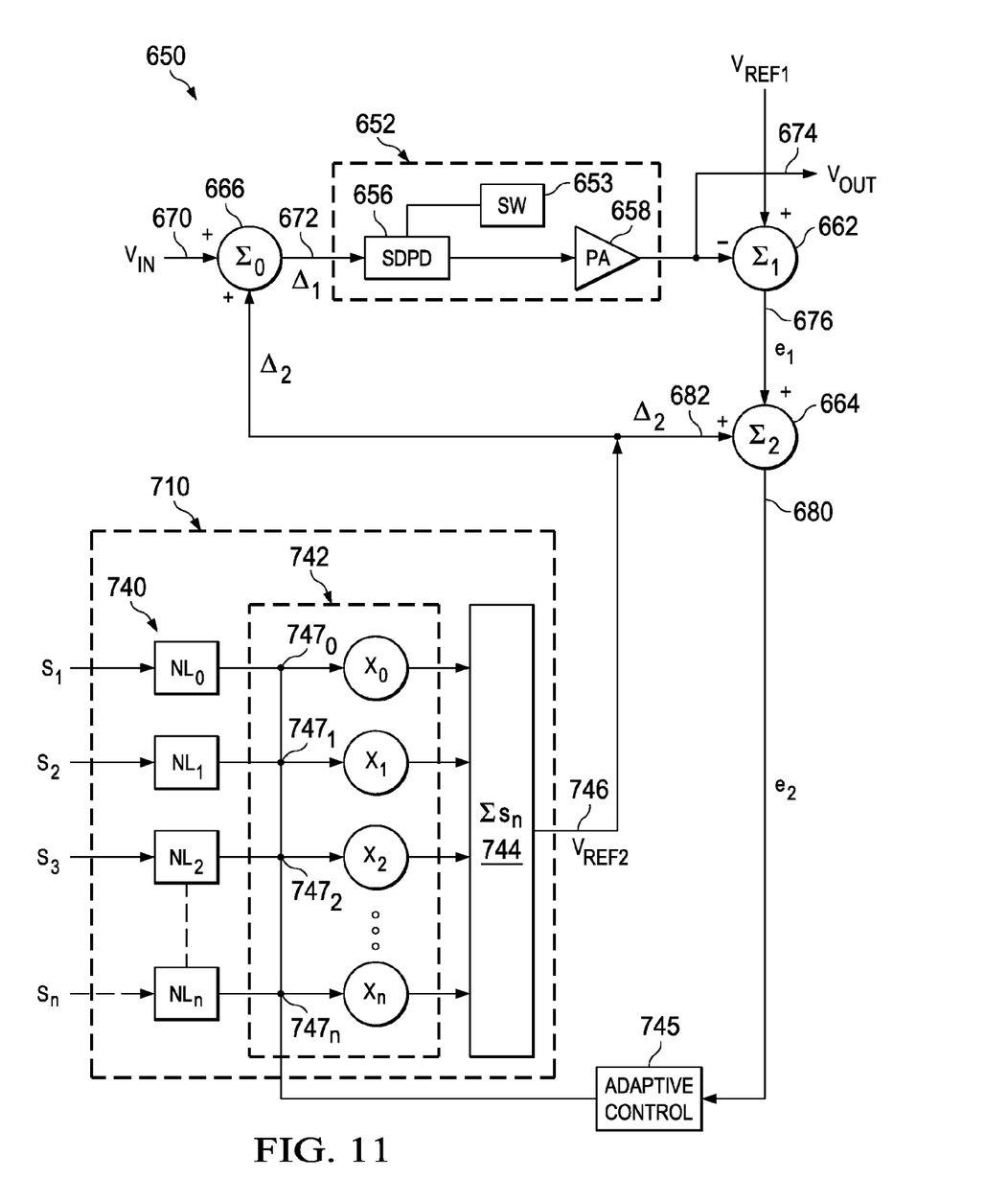
FIG. 11 is a schematic diagram of a fifth embodiment of a supplemental or additional response apparatus configured according to the present invention.

FIG. 11 is a schematic diagram of a fifth embodiment of a supplemental or additional response apparatus configured according to the present invention. In FIG. 11, an apparatus 650 is configured to provide non-linear adaptive signal tracking for a non-linear device 652. Non-linear device 652 may include, by way of example and not by way of limitation, a distortion correcting section 656 and a power amplifier 658. Non-linear device 652 operates in conjunction with software 653. Distortion correcting section 656 may be configured substantially as one of distortion correcting section 32 (FIG. 2) or distortion correcting section 52 (FIG. 3) or another distortion correcting section. Non-linear device 652 may be embodied in any system, apparatus or device having non-linear characteristics. By way of further example and not by way of limitation, non-linear device 652 may be embodied in a manufacturing device or plant, in an auto-pilot system or another non-linear system.

Apparatus 650 also includes a supplemental correcting section 654. Supplemental correcting section 654 includes an adaptive circuit 660 and summing nodes 662, 664, 666. Apparatus 650 may also include various delay units to ensure synchrony of signals treated by summing nodes 662, 664, 666 (not shown in FIG. 11), generally as discussed in connection with other embodiments of the apparatus of the present invention herein (see, FIGS. 4, 6, 8-9).

Apparatus 650 receives an input signal $V_{IN}$ at an input node 670. Input signal $V_{IN}$ is provided to summing node 666. A first correcting signal $\Delta_1$ is provided from summing node 666 a distortion input node 672 for non-linear device 652. Non-linear device 652 treats first correcting signal $\Delta_1$ received at distortion input node 672 to present an output signal $V_{OUT}$ at an output node 674 and to summing node 662. A first reference signal $V_{REF1}$ is also provided to summing node 662. Summing node 662 combines signals $V_{OUT}$, $V_{REF1}$ and presents a difference or error signal $e_1$ to summing node 664. Error signal $e_1$ indicates a difference or error relating to a difference between signals $V_{OUT}$, $V_{REF}$. Error signal $e_1$ indicates an aggregate error for non-linear device 652.

Summing node 664 presents a second difference or error signal $e_2$ at an output node 680. Second error signal $e_2$ indicates a difference or error between first error signal $e_1$ and a signal provided at an input node 682 to summing node 664.

Adaptive circuit 660 is coupled to receive second error signal $e_2$ and adaptively adjust second error signal $e_2$ to apply a second correcting signal $\Delta_2$ to input node 682 to summing node 664. Second correcting signal $\Delta_2$ is applied to input node 682 to reduce second error signal $e_2$. Second correcting signal $\Delta_2$ is also applied to summing node 666. Summing node 666 employs signals $V_{OUT}$, $\Delta_2$ to create first correcting signal $\Delta_1$.

Thus, one may observe in FIG. 11 that a first loop segment A, a second loop segment B and a third loop segment C are combined to establish a first correction loop 700 employing adaptive circuit 660 to reduce second error signal $e_2$ and a second correction loop 700 reducing first error signal $e_1$ to make input signal $V_{IN}$ approach first reference signal $V_{REF1}$. When a second reference signal $V_{REF2}$ is applied to adaptive circuit 660, a fourth loop segment D is employed in connection with loop segments B, C to establish a third correction loop 704 reducing first error signal $e_1$ to make input signal $V_{IN}$ approach first reference signal $V_{REF1}$ taking second reference signal $V_{REF2}$ into account.

By way of example and not by way of limitation, non-linear device 652 may be embodied in an auto-pilot unit. First reference signal $V_{REF1}$ may be an electrical representation of a desired flight plan. Second reference signal $V_{REF2}$ may be a single second reference signal $V_{REF2}$. Alternatively, second reference signal $V_{REF2}$ may be an aggregate signal representing parameters known to affect performance of auto-pilot unit/non-linear device 652, such as altitude, temperature, prevailing winds, magnetic declination, and other factors. In such an embodiment, second reference signal $V_{REF2}$ may be provided by an adaptive circuit 710. Adaptive circuit 710 includes a non-linear calculating section 740, a weighting section 742 and a summing unit 144. Non-linear calculating section 740 includes a plurality of non-linear calculating units $NL_0$, $NL_1$, $NL_2$, ... $NL_n$. Weighting section 742 includes a plurality of weighting units $X_o$, $X_1$, $X_2$, ... $X_n$. The indicator "n" is employed to signify that there can be any number of calculating units and weighting units in adaptive circuit 710. The inclusion of four calculating units $NL_0$, $NL_1$, $NL_2$, ... $NL_n$ and four weighting units $X_0$, $X_1$, $X_2$, ... $X_n$ in FIG. 11 is illustrative only and does not constitute any limitation regarding the number of calculating units and weighting units that may be included in the adaptive circuit of the present invention.

Indicator signal $S_i$, $S_2$, $S_3$, $S_n$, are coupled for input to respective calculating units $NL_0$, $NL_1$, $NL_2$, ... $NL_n$. Each respective calculating unit $NL_n$ is coupled for operation with a respective weighting unit $X_n$. Weighted calculation results are provided from weighting section 742 to summing unit 744. An aggregate weighted result is presented at an output node 746 for input to adaptive circuit 660. Second error signal $e_2$ is provided to an adaptive control unit 745. Adaptive control unit 745 develops weight factors for each weighting unit $X_0$, $X_1$, $X_2$, ... $X_n$ and provides a respective weight values for use by each respective weighting unit $X_0$, $X_1$, $X_2$, ... $X_n$ at a respective node $747_0$, $747_1$, $747_2$, $747_n$.

Figure 12:
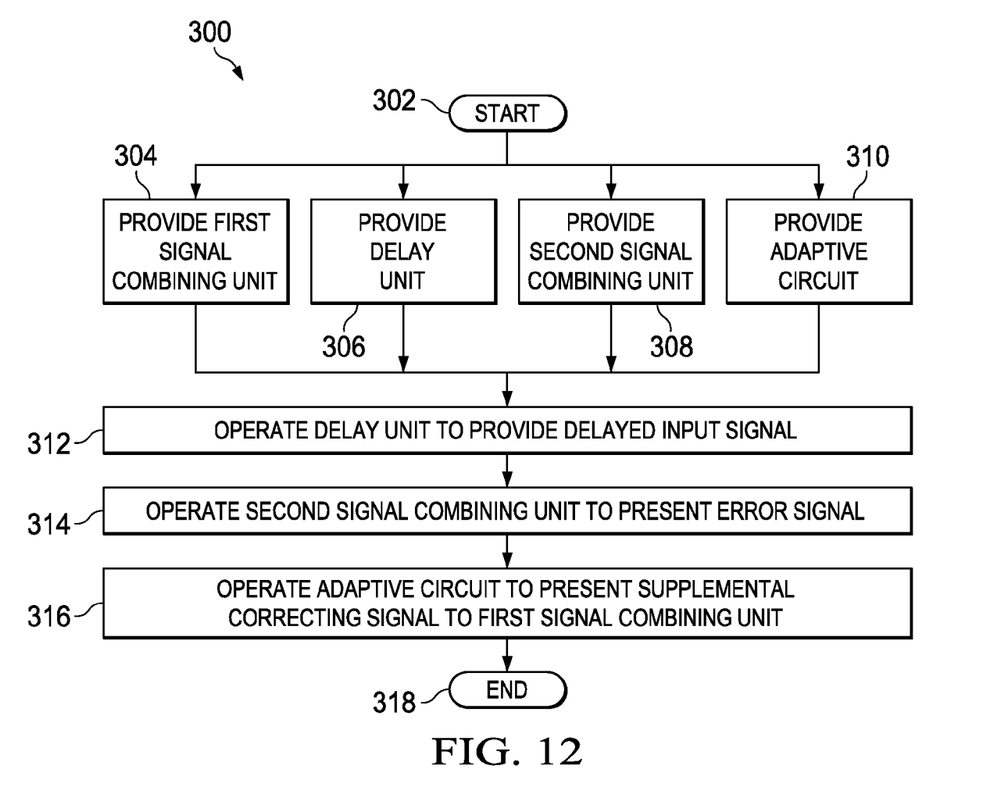
FIG. 12 is a flow chart illustrating the method of the present invention.

FIG. 12 is a flow chart illustrating the method of the present invention. In FIG. 12, a method 300 for providing additional response for a distortion correcting device begins at a START 302. The distortion correcting device receives a first signal at a correcting input node and provides an output signal at an output node. The output signal is delayed with respect to the first signal by a first delay interval. Method 300 continues with the step of, in no particular order: (1) providing a first signal combining unit coupled to an input node and with the correcting input node, as indicated by a block 304; (2) providing a delay unit coupled to the input node, as indicated by a block 306; (3) providing a second signal combining unit coupled to the first delay unit and with the output node, as indicated by a block 308; and (4) providing at least one adaptive circuit coupled to the input node, the first signal combining unit and the second signal combining unit, as indicated by a block 310.

Method 300 continues with operating the delay unit to receive an input signal from the input node and provide a delayed input signal to a first delayed signal terminal, as indicated by a block 312. The delayed input signal is delayed with respect to the input signal by a second delay interval. The second delay interval is substantially equal to the first delay interval.

Method 300 continues with operating the second signal combining unit to employ the output signal and the delayed input signal to present an error signal at a first error indicating terminal, as indicated by a block 314.

Method 300 continues with operating the at least one adaptive circuit to employ a feedback signal related with the error signal and the input signal to present a supplemental correcting signal to the first signal combining unit, as indicated by a block 316. The first signal combining unit employs the input signal and the supplemental correcting signal to present the first signal to the correcting input node. The supplemental correcting signal is appropriate to reduce the error signal. Method 300 terminates at an END 318.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

I claim:

1. An apparatus that non-linear adaptive signal tracking for a non-linear device comprising:
    a first signal combining unit coupled to an input node;
    a second signal combining unit coupled to an output node, wherein the second signal combining unit employs an output signal and a first reference signal to present a difference signal at a first difference indicating terminal; and
    an adaptive circuit coupled to the first difference indicating terminal and the first signal combining unit, wherein the adaptive circuit employs a second reference signal and the difference signal to present a correcting signal to the first signal combining unit and wherein the first signal combining unit employs the input signal and the correcting signal to present the first signal to the input node, and wherein the correcting signal is appropriate to reduce the difference signal, and wherein the second reference signal is a weighted combination of a plurality of parametric signals that each represent a respective performance response of the non-linear device.

2. The apparatus as recited in claim 1 wherein the first reference signal represents a desired output signal.

3. The apparatus recited in claim 1 wherein the first reference signal represents a desired output signal and wherein the second reference signal represents at least one factor affecting performance of the non-linear device.

4. An apparatus providing additional response for an error correcting device, the error correcting device receiving a first signal at a correcting input node and providing an output signal at an output node, the output signal is delayed with respect to the first signal by a first delay interval, the apparatus comprising:
    a first signal combining unit coupled to an input node and to the correcting input node;
    a delay unit coupled to the input node wherein the delay unit receiving an input signal from the input node and providing a delayed input signal to a first delayed signal terminal and wherein the delayed input signal is delayed with respect to the input signal by a second delay interval and wherein the second delay interval is substantially equal to the first delay interval;
    a second signal combining unit coupled to the first delayed signal terminal and with the output node, wherein the second signal combining unit employing the output signal and the delayed input signal to present an error signal at a first error indicating terminal; and
    an adaptive circuit coupled to the input node, the first signal combining unit and the second signal combining unit, wherein the adaptive circuit employs a feedback signal related to the error signal and the input signal to present a supplemental correcting signal to the first signal combining unit, and wherein the first signal combining unit employs the input signal and the supplemental correcting signal to present the first signal to the correcting input node, and wherein the supplemental correcting signal is appropriate to reduce the error signal.

5. The apparatus as recited in claim 4 wherein the adaptive circuit includes an adjustable signal approximating unit coupled to the input node and the error indicating terminal, wherein the signal approximating unit treats the error signal and the input signal to present an adjusting signal, and wherein the adjusting signal is related to the correcting signal.

6. The apparatus as recited in claim 5 wherein the adaptive circuit further includes a third signal combining unit coupled to the error indicating terminal and to the at least one signal approximating unit, wherein the third signal combining unit and the signal approximating unit cooperate to present a revised error signal for use by the signal approximating unit in presenting the adjusting signal.

7. The apparatus as recited in claim 6 wherein the signal approximating unit is an additive signal approximating unit.

8. The apparatus as recited in claim 5 wherein the signal approximating unit is an additive signal approximating unit.

9. The apparatus as recited in claim 5 wherein the adaptive circuit further includes a third signal combining unit coupled to the error indicating terminal and a fourth signal combining unit coupled to the third signal combining unit, wherein the third and fourth signal combining units are each coupled to the signal approximating unit, wherein the third signal combining unit and the signal approximating unit cooperate with a second delay unit to present a first-revised error signal including an imposed delay, and wherein the fourth signal combining unit and the signal approximating unit cooperate with a third delay unit to present a second-revised error signal without the imposed delay, and wherein the signal approximating unit treating the second-revised error signal and the input signal to present an adjusting signal, and wherein the adjusting signal is related to the correcting signal.

10. The apparatus as recited in claim 9 wherein the approximating unit is an additive signal approximating unit.

11. A method for providing additional response for an error correcting device, wherein the error correcting device receives a first signal at a correcting input node and provides an output signal at an output node, and wherein the output signal is delayed with respect to the first signal by a first delay interval, the method comprising the steps of:

operating a delay unit to receive an input signal from an input node and provide a delayed input signal to a first delayed signal terminal, wherein the delayed input signal is delayed with respect to the input signal by a second delay interval, and wherein the second delay interval is substantially equal to the first delay interval;

operating a second signal combining unit to employ the output signal and the delayed input signal to present an error signal at a first error indicating terminal; and operating an adaptive circuit to employ a feedback signal related with the error signal and the input signal to present a supplemental correcting signal to the first signal combining unit, wherein the first signal combining unit employs the input signal and the supplemental correcting signal to present the first signal to the correcting input node, wherein the supplemental correcting signal is appropriate to reduce the error signal.

12. The method as recited in claim 11 wherein the step of operating the adaptive circuit further comprises operating a signal approximating unit that treats the error signal and the input signal to present an adjusting signal, wherein the adjusting signal is related to the correcting signal.

13. The method as recited in claim 12, wherein step of operating the adaptive circuit further comprises operating a third signal combining unit and the signal approximating unit in cooperation with one another to present a revised error signal for use by the signal approximating unit in presenting the adjusting signal.

* * * * *